United States Patent [19]

Corley

[11] Patent Number: 5,086,139
[45] Date of Patent: Feb. 4, 1992

[54] COMPOSITION COMPRISING BISIMIDE AND TRIENE

[75] Inventor: Larry S. Corley, Houston, Tex.

[73] Assignee: Shell Oil Company, Houston, Tex.

[21] Appl. No.: 545,745

[22] Filed: Jun. 29, 1990

[51] Int. Cl.$^5$ ................................. C08F 22/40
[52] U.S. Cl. ........................... 526/262; 524/548; 526/335; 526/336; 528/322
[58] Field of Search ............ 526/262, 335, 336; 528/322; 524/548

[56] References Cited

U.S. PATENT DOCUMENTS

| | | | |
|---|---|---|---|
| 4,100,140 | 7/1978 | Zahir et al. | 526/90 |
| 4,211,860 | 7/1980 | Stenzenberger | 528/312 |
| 4,220,741 | 9/1980 | Renner et al. | 525/422 |
| 4,288,583 | 9/1981 | Zahir et al. | 526/262 |
| 4,518,754 | 5/1985 | Locatelli et al. | 526/262 |
| 4,526,925 | 7/1985 | Parker et al. | 524/548 |
| 4,730,030 | 3/1988 | Hahn et al. | 526/262 |
| 4,927,907 | 5/1990 | Corley | 528/322 |

Primary Examiner—Harold D. Anderson

[57] ABSTRACT

A modified bisimide resin is prepared by copolymerizing a bisimide monomer and a reactive triene which contains a conjugated double bond capable of Diels-Alder reaction with the bisimide and an isolated double bond. The copolymerization of a bisimide with a reactive triene such as myrcene provides a modified bisimide having good fracture toughness.

25 Claims, No Drawings

COMPOSITION COMPRISING BISIMIDE AND TRIENE

BACKGROUND OF THE INVENTION

This invention relates to thermosettable bisimide compositions. In one aspect, the invention relates to the preparation of cured bismaleimide resins having enhanced fracture toughness and processability.

Advanced composites are high-performance materials made up of a fiber-reinforced thermoplastic or thermosettable material. The thermosettable materials useful in advanced composites must meet a set of demanding property requirements. For example, such materials optimally have good high-temperature properties such as high (above 200° C.) cured glass transition temperature and relatively low (less than 4%) water absorbance at elevated temperature. Such materials must also exhibit high mechanical strength, as measured by fracture toughness and compression after impact. For ease of processing in preparing prepregs for composite parts, the uncured material will ideally have a low (below 120° C.) melting temperature and a wide temperature range of processable viscosity (a wide "processing window").

Bismaleimide resins are thermosettable materials with much promise for use in advanced composites. Disadvantages of bismaleimides, however, include brittleness and high melting points, the latter of which requires bismaleimides to be used with solvents for acceptable processability.

Standard modifiers for bismaleimides have a number of disadvantages. Some, such as styrene, divinylbenzene, diisopropenylbenzene and certain derivatives thereof, are extremely reactive with maleimide groups by both Diels-Alder and radical mechanisms. This leads to a very short pot life for bismaleimide mixtures with these reactive diluents. These materials, while providing more easily processable bismaleimide resins, tend to be ineffective as tougheners for the resins. Diamines and dithiols generally share this disadvantage of high reactivity, and also the adducts of maleimide groups with amines or thiols are of somewhat low thermal stability. Other diluent modifiers, such as bisallyl, bis(allyloxy) or bispropenyl aromatic compounds, including dialyl bisphenol-A and adducts of allylphenols with epoxy resins, are somewhat less reactive than the vinyl aromatics but still have a pot life in the melt which is relatively short for many types of liquid processing applications.

It is therefore an object of the invention to provide bisimide resin compositions having enhanced physical properties and good processability for composites applications.

BRIEF SUMMARY OF THE INVENTION

According to the invention, a curable composition is provided comprising a bisimide and a reactive triene which is characterized by a conjugated diene moiety capable of unhindered Diels-Alder reaction with the bisimide and an isolated double bond. The copolymerization of a bisimide with a triene such as myrcene provides a cured bisimide composition with good fracture toughness.

DETAILED DESCRIPTION OF THE INVENTION

The invention composition includes a bisimide. Preferred bisimides include N,N'-bisimides of unsaturated dicarboxylic acids which can be represented by the formula

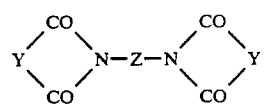

in which Y is a substituted or unsubstituted divalent group containing at least 2 carbon atoms, preferably 2 to 6 carbon atoms, and a carbon-carbon double bond, and Z is a divalent radical comprising at least 1, generally about 1 to 40 carbon atoms. Z can be aliphatic, cycloaliphatic, aromatic or heterocyclic. A preferred class of bisimides are difunctional bismaleimides derived from an aromatic diamine which can be represented by the formula

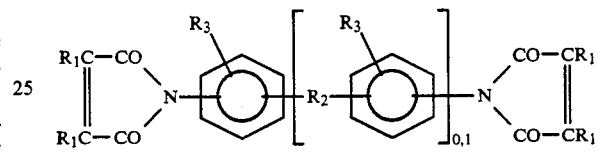

in which each $R_1$ is selected independently from H, $C_{1-2}$ alkyl or halide; $R_2$ is selected from divalent hydrocarbon radicals containing from about 1 to about 10 carbon atoms, —O—, —SO$_2$—, —COO—, —CONH—, —CO— and —S—; and each $R_3$ is selected independently from H, $C_{1-3}$ alkyl and halide.

Specific examples of bisimides include
1,2-bismaleimidoethane
1,6-bismaleimidohexane
1,3-bismaleimidobenzene
1,4-bismaleimidobenzene
2,4-bismaleimidotoluene
4,4'-bismaleimidodiphenylmethane
4,4'-bismaleimidodiphenylether
3,3'-bismaleimidodiphenylsulfone
4,4'-bismaleimidodiphenylsulfone
4,4'-bismaleimidodicyclohexylmethane
3,5-bis(4-maleimidophenyl)pyridine
2,6-bismaleimidopyridine
1,3-bis(maleimidomethyl)cyclohexane
1,3-bis(maleimidomethyl)benzene
1,1-bis(4-maleimidophenyl)cyclohexane
1,3-bis(dichloromaleimido)benzene
4,4'-biscitraconimidodiphenylmethane
2,2-bis(4-maleimidophenyl)propane
1-phenyl-1,1-bis(4-maleimidophenyl)ethane
α,α-bis(4-maleimidophenyl)toluene
3,5-bismaleimido-1,2,4-triazole
and various bismaleimides disclosed in U.S. Pat. Nos. 3,562,223, 4,211,860 and 4,211,861. Bismaleimides can be prepared by methods known in the art, as described in U.S. Pat. No. 3,018,290, for example.

The bismaleimide resin can contain imide oligomer according to the formula

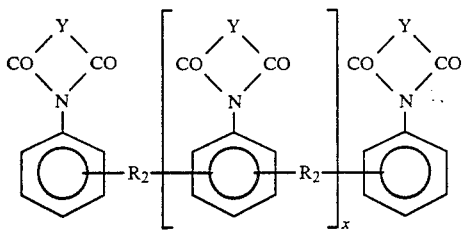

in which x is a number within the range of about 0 to about 0.5. Such oligomers may be present as an impurity in difunctional bisimides.

The preferred bisimide resin is N,N'-4,4'-diphenylmethane bismaleimide. The bisimide can contain various additives and modifiers as processing aids. The bisimide resin component can be a reaction product or prepolymer of a bisimide and an effective chain-extending agent such as an amine group-containing compound. Suitable amine group-containing compounds include diamines and polyamines represented by the general formula $(H_2N)_nQ$ or $(RNH)_nQ$ and aminophenols represented by the general formula $(NH_2)_nQ(OH)_n$ or $(RNH)_nQ(OH)_n$, in which Q is a divalent aromatic or alicyclic group and n is a number such that the average number of amine hydrogens per molecule in the amine mixture falls between about 1.95 an 2.5. Examples include bis(4-(N-methylamino)phenyl)methane, N,N'-dimethyl-1,3-diaminobenzene and the like. Such reaction products can be prepared by methods known in the art, such as contacting about 0.1 to about 0.8 mole of the chain-extending agent with each mole of the bisimide in an organic solvent at a temperature of about 40° to 200° for a time of about 5 minutes to 5 hours. The bisimide can be, for example, a hydrazide-modified bismaleimide as described in U.S. Pat. No. 4,211,860 and 4,211,861. Suitable N,N'-unsaturated bismaleimide resins are commercially available from Technochemie GmbH as Compimide ® resins, for example. The bisimide can be a mixture of bisimides described above tailored to meet specific processing requirements.

The invention composition includes a reactive triene characterized by a conjugated diene moiety capable of unhindered Diels-Alder reaction with the Y moiety of the above-described bisimide and an isolated double bond separated from the conjugated pair by a chemical linking group. Such trienes can be represented by one of formulas I and II:

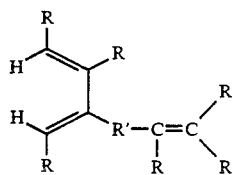 (I)

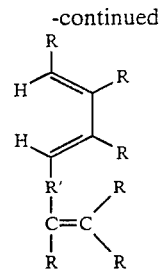

in which each R is selected independently from hydrogen and $C_{1-3}$ alkyl, and R' is a divalent linking group. R' can be, for example, alkylene, preferably $C_{2-12}$ alkylene; $-(CH_2)_nR''(CH_2)_n$ and $-O-R''-O-$, in which n is an integer from 1 to about 6 and R'' is $C_{1-12}$ alkylene, carbonyl, phenylene, and the like. The preferred R' linking group is $C_{2-12}$ alkylene, as in myrcene and trans-1,3,7-octatriene. The conjugated diene group must be capable of Diels-Alder reaction with the Y moiety of the bisimide and must not contain substituents in positions which would block the approach of a Diels-Alder dienophile when the diene group is in the cisoid confirmation, as in cis-1,3,7-octatriene, for example. The isolated double bond should be adjoined by at least one hydrogen-bearing carbon atom. Because of the fracture toughness and high-temperature properties achievable in the resulting bisimide copolymer, myrcene is the preferred triene comonomer.

The bismaleimide and the triene are combined in a molar ratio of triene:bisimide within the range of about 0.2 to 1.0, preferably about 0.3 to about 0.9, most preferably about 0.4 to about 0.8, in order to achieve the desired physical properties in the cured composition.

The bisimide and triene may be combined in any manner desired, such as melt, solution or powder blending. The preferred technique involves melting a mixture of the solid reactants at a temperature above the respective melting points but below the polymerization temperature of either monomer, and stirring the melt until a homogeneous mixture is achieved. The melt may also be held at temperatures above about 150° C. for desired periods of time in a process of prepolymerization to increase the crystallization resistance of the melt and/or to increase its viscosity to desired levels. The mixture can then be poured directly into a mold for polymerization, or it can be directly cooled for later polymerization.

The composition may contain an optional free radical inhibitor to inhibit free radical polymerization of the bisimide monomer. Generally, the free radical inhibitor will be present in the composition in an amount within the range of about 0.0002 to about 0.02 moles per mole of the bisimide, preferably from about 0.001 to about 0.01 moles. The free radical inhibitor can be added to the monomers in any manner effective for intimate blending of the monomers and free radical inhibitor. Free radical inhibitors include phenols such as t-butylcatechol, hydroquinone and p-methoxy-phenol; quinones such as 1,4-benzoquinone and 1,4-naphthoquinone; polynitro aromatics such as picric acid and 2,4,6-trinitrotoluene; hydroxylamines such as diethylhydroxylamine; stable radicals such as di-t-butylnitroxide or diphenylpicrylhydrazyl; and certain polycyclic heterocycles such as phenothiazine. The preferred free radical inhibitor is phenothiazine.

Polymerization is effected by heating the mixture to a temperature effective to initiate reaction between the functional groups of the bisimide and the double bonds of the triene. The temperature is generally at least about 150° C., preferably within the range of about 170° to about 350° C., held for a time of about 2 hours or more, with the required reaction time dependent on the temperature-staging program used.

In order to achieve optimum properties in the copolymers, a mixture of the monomers and free radical inhibitor is heated at a temperature near or above the ultimate (fully cured) glass transition temperature of the copolymer composition for a time sufficient to produce essentially complete reaction of the monomers. "Essentially complete" reaction of the monomers has been reached when no further reaction exotherm is observed by differential scanning calorimetry (DSC) upon heating the copolymer. The time of the heat treatment, or "post-cure," will vary depending upon the monomers, the degree of pressure applied and any precuring of the monomer mixture.

The copolymers are useful as resin matrices for composites in aerospace and electronics applications, including large structural parts and circuit boards. Based on their long shelf life and relatively low melting point, some of the uncured mixtures are useful for making tacky prepregs which can then be molded into composites. They are also suitable for liquid resin processing methods such as filament winding, resin transfer molding, resin infusion molding, and pultrusion if the mixtures are heated to provide sufficiently low viscosity for fiber impregnation. The low dielectric constants of the cured copolymers make them suitable for electrical applications such as the manufacture of circuit boards.

For preparation of reinforced laminate materials, a fibrous substrate of glass, carbon, quartz, poly(p-phenyleneterephthalamide), polyester, polytetrafluoroethylene, poly(p-phenylenebenzobisthiazole), boron, paper or like material, in chopped, mat or woven form, is impregnated with a bisimide/triene composition in molten or solution form. A prepreg is formed by heating the impregnated substrate in an oven at a temperature sufficient to remove the solvent and optionally to partially cure without gelation, or "B-sage," the resin system, generally about 180° C. to about 230° C., preferably about 200 to about 220° C., for a time of up to about 2 hours, preferably about 10 to about 40 minutes. A laminate is fabricated by subjecting a set of layered prepregs to conditions effective to cure the resins and to integrate the prepregs into a laminated structure. The laminate can optionally include one or more layers of a conductive material such as copper. Laminating generally involves subjecting the prepregs to a temperature above about 200° C., preferably from about 210° to about 350° C., for a time of at least about 1 hour, at a pressure within the range of about 50 to about 500 psi.

For some laminating applications, especially if the bisimide/triene mixture will be dissolved in a solvent before impregnation of the substrate, it may be advantageous to heat treat, or upstage, the bisimide/triene mixture prior to application to a laminating substrate, particularly if the mixture will be stored prior to use. Suitable heat treatment involves subjecting the bisimide/triene to an elevated temperature for a time sufficient to cause sufficient reaction and viscosity increase to inhibit crystallization of either or both monomers for the mixture upon storage, but not sufficient to gel the composition.

EXAMPLE 1

Myrcene (SCM Glidco P&F grade) and bis(4-maleimidophenyl)methane (MDAB) were weighed into glass beakers in the proportions shown in Table 1 below (mixture sizes were from 5 to 80 grams). To all mixtures was added phenothiazine at a level of 0.53–0.54 mole % (based on MDAB). The beakers were then heated in an oil bath at approximately 150° C., with stirring, until the contents were homogeneous. The mixtures were then poured into a rectangular stainless steel mold with a 2.8 (or 3.2) mm thick cavity, with the mold parts separated by an airtight rubber gasket such that the mold could be pressurized during cure. The mold was then placed into an oven (under 70–100 psig nitrogen pressure) and the systems were cured as shown in Table 1. (Small portions of mixtures 4,6 and 8 from Table 1 were cooled to room temperature and saved for use in the cure rheological studies described in Example 2.)

Two control castings were also prepared. The first (control casting #1) was from a mixture of 70 mole% MDAB, 15 mole % of 2,4-bismaleimidotoluene, and 15 mole% of 1,3-bismaleimidobenzene (containing 0.53–0.54 mole% phenothiazine, basis total bismaleimides). This mixture was used instead of unmodified MDAB because of the difficulty in pouring molten MDAB into casting molds due to its tendency to crystallize on slight cooling. The initial cure temperature used for the unmodified bismaleimide (210° C.) was higher than for the other systems (150° C.) because of the extremely slow cure rate of the unmodified BMI blend at the lower temperature. Control casting #2 was made from a standard commercial toughened bismaleimide system containing 63.4 mole% MDAB, 34.5 mole% of 2,4-bismaleimidotoluene, and 2.1 mole% of 1,5-bismaleimido-2,2,4-trimethylpentane. This BMI mixture was chain-extended and toughened with the 2:1 adduct of o-allylphenyl with resorcinol diglycidyl ether (31.5 mole% with with respect to total bismaleimides). The control castings were similarly cured as shown in Table 1.

The molds were then allowed to cool and the cured resin castings were removed from the molds. Physical properties of the castings were then determined as shown in Table 1. One can see that the myrcene/MDAB blends provide a number of advantages over the control castings of the unmodified BMI mixture and the commercial toughened system. The unmodified BMI mixture forming a casting (control #1) which was so brittle that samples for mechanical testing could not be machined successfully without cracking. All of the myrcene blends were considerably lower in water absorption than the commercial toughened BMI system (control #2). Similarly, all of the MDAB/myrcene blends tested (except one containing a relatively low amount of myrcene) were superior to the commercial toughened BMI system in wet flexural strength and modulus at 93° C., even though the corresponding values under dry conditions at room temperature were lower for the myrcene blends. The myrcene/MDAB blends were also somewhat lower in dielectric constant than the commercial material (desirable in many electrical applications).

TABLE 1

Properties of Castings

| Casting | Myrcene/MDAB molar ratio | Cure cycle[a] | Dynamic mechanical Tg, °C | R.T. dry (93° C. wet) flexural (ASTM D-790) | | | Compact tension fracture toughness, $K_q$, MPa-m$^{\frac{1}{2}}$ (ASTM E 399-83) |
|---|---|---|---|---|---|---|---|
| | | | | Strength, MPa | Modulus, GPa | Elong., % | |
| 1 | 0.25 | A | >>370 | 75 ± 5 (48 ± 14) | 3.93 ± 0.02 (3.31 ± 0.03) | 2.0 ± 0.1 (1.5 ± 0.4) | 0.50 ± 0.04 |
| 2 | 0.35 | A | 397 | 87 ± 16 (84 ± 4) | 3.67 ± 0.06 (3.02 ± 0.03) | 2.6 ± 0.6 (2.9 ± 0.2) | 0.50 ± 0.02 |
| 3 | 0.45 | A | 387 | 117 ± 5 (75 ± 5) | 3.33 ± 0.01 (2.71 ± 0.01) | 4.1 ± 0.2 (2.9 ± 0.2) | 0.66 ± 0.2 |
| 4 | 0.55 | A | 365 | 117 ± 10 (82 ± 7) | 3.32 ± 0.04 (2.51 ± 0.02) | 4.3 ± 0.7 (3.8 ± 0.5) | 0.58 ± 0.02 |
| 5 | 0.65 | A | 321 | 106 ± 15 (75 ± 6) | 3.14 ± 0.07 (2.51 ± 0.05) | 4.2 ± 0.9 (3.4 ± 0.3) | 0.69 ± 0.03 |
| 6 | 0.75 | A | 276 | 135 ± 6 (92 ± 6) | 3.31 ± 0.06 (2.62 ± 0.04) | 6.3 ± 1.1 (4.6 ± 0.8) | 0.69 ± 0.01 |
| 7 | 0.85 | A | 237 | 109 ± 19 (83 ± 4) | 3.50 ± 0.03 (2.83 ± 0.03) | 3.6 ± 0.8 (3.1 ± 0.2) | 0.66 ± 0.05 |
| 8 | 0.95 | A | 208 | 101 ± 7 (77 ± 6) | 3.62 ± 0.03 (2.81 ± 0.08) | 3.0 ± 0.1 (3.0 ± 0.3) | 0.75 ± 0.03 |
| 9 | 1.05 | A | [b] | 8[c] (26 ± 7) | 3.69[c] (1.55 ± 0.01) | 0.22[c] (2.1 ± 0.7) | [b] |
| Control #1 (unmodified BMI blend) | | B | [b] | [b] | | | [b] |
| Control #2 (commerical system) | | A | 320 | 145 ± 21 (69 ± 10) | 4.17 ± 0.11 (2.44 ± 0.01) | 4.6 ± 1.1 (3.5 ± 0.9) | 0.70 ± 0.06 |

| Casting | Dielectric constant (dissipation factor), 1 MHz (ASTM D 229/15) | Time | Solvent pickup, % | | |
|---|---|---|---|---|---|
| | | | 93° C. H$_2$O | R.T. MEK | R.T. CH$_2$Cl$_2$ |
| 1 | 3.23 (0.0116) | 1 day | 3.07 | −0.58 | −0.01 |
| | | 2 days | 3.23 | −0.73 | 0.09 |
| | | 1 week | 3.64 | −1.07 | 0.41 |
| | | 2 weeks | 3.90 | −1.28 | 0.88 |
| 2 | 3.28 (0.0128) | 1 day | 2.97 | −0.58 | 0.04 |
| | | 2 days | 3.07 | −0.77 | 0.10 |
| | | 1 week | 3.35 | −1.15 | 0.73 |
| | | 2 weeks | 3.51 | −1.33 | 1.43 |
| 3 | 3.07 (0.0113) | 1 day | 2.86 | −0.49 | 0.33 |
| | | 2 days | 2.99 | −0.62 | 0.63 |
| | | 1 week | 3.22 | −0.91 | 2.40 |
| | | 2 weeks | 3.27 | −1.00 | 4.61 |
| 4 | 3.22 (0.0120) | 1 day | 3.17 | −0.37 | 1.88 |
| | | 2 days | 3.24 | −0.52 | 3.18 |
| | | 1 week | 3.42 | −0.75 | 8.35 |
| | | 2 weeks | 3.50 | −0.93 | 16.6 |
| 5 | | 1 day | 2.98 | −0.38 | 4.87 |
| | | 2 days | 3.09 | −0.49 | 7.68 |
| | | 1 week | 3.27 | −0.71 | 19.1 |
| | | 2 weeks | 3.28 | −0.87 | 36.0 |
| 6 | 3.07 (0.0105) | 1 day | 2.86 | −0.25 | 15.7 |
| | | 2 days | 2.63 | −0.35 | 25.2 |
| | | 1 week | 2.81 | −0.52 | 66.2 |
| | | 2 weeks | 2.84 | −0.62 | 66.8 |
| 7 | | 1 day | 1.89 | −0.15 | (disintegrated) |
| | | 2 days | 2.00 | −0.22 | |
| | | 1 week | 2.16 | −0.35 | |
| | | 2 weeks | 2.20 | −0.41 | |
| 8 | 2.96 (0.0074) | 1 day | 1.68 | −0.13 | (disintegrated) |
| | | 2 days | 1.79 | −0.16 | |
| | | 1 week | 1.93 | −0.25 | |
| | | 2 weeks | 1.98 | −0.39 | |
| 9 | [b] | 1 day | 1.26 | 2.30 | (dissolved) |
| | | 2 days | 1.46 | 4.91 | |
| | | 1 week | 1.79 | 24.8 | |
| | | 2 weeks | 1.94 | 36.7 | |
| Control #1 (unmodified BMI blend) | [b] | | | | |
| Control #2 (commerical system) | 3.37 (0.0141) | 1 day | 3.77 | −0.29 | −0.10 |
| | | 2 days | | −0.41 | −0.10 |
| | | 1 week | 4.92 | −0.62 | 0.08 |

TABLE 1-continued

| Properties of Castings | | | | |
|---|---|---|---|---|
| | 2 weeks | 5.20 | −0.79 | 0.32 |

<sup>a</sup>Cure cycles:
A = (under 700 kPa (~85 psig) nitrogen pressure) 1 hr. at 150° C., 1 hr. at 180° C., 1 hr. at 210° C., 30 min. at 230° C., 30 min. at 250° C., 30 min. at 270° C. and 1 hr. at 290° C.
B = (under 700 kPa (~85 psig) nitrogen pressure) 3 hr. at 210° C., 15 min. at 230° C., 15 min. at 250° C., 15 min. at 270° C. and 15 min. at 290° C., with pressure then released to atmospheric followed by 15 min. at 310° C. and 30 min. at 330° C.
<sup>b</sup>Material was so brittle that test pieces could not be machined without cracking.
<sup>c</sup>No error limits are given because only one test sample was available.

EXAMPLE 2

This example shows the wide "processing window" during cure of myrcene blends in comparison with a standard commercial BMI mixture. The retained uncured mixtures 4,6 and 8 from Table 1 were placed between the plates of a parallel plate viscometer and heated at a rate of 10° C./min. Viscosity (under 11 Hz oscillatory shear) was determined for each mixture as a function of temperature at this heating rate. The same viscosity test under heating was also performed on a control sample of the commercial toughened BMI system from Example 1. The two systems showed similar viscosity behavior at lower temperatures, dropping in viscosity from semisolids at room temperature to 1 Pa.s in viscosity at approximately 100° C. (On further heating of a curable resin system, viscosity will pass through a minimum followed by an upturn as the system reaches a temperature where cure reactions progress rapidly.) The commercially toughened BMI system rose again to 1 Pa. in viscosity at 219° C., while the myrcene blends did not reach this viscosity until 270° C. (The exact position of the viscosity minimum was unknown because the viscometer used could not accurately measure viscosities below about 0.5 Pa.s.) The more delayed viscosity increase in the myrcene blends, however, illustrates this wider "processing window" for liquid processing applications.

EXAMPLE 3

For comparison, a series of experiments were done to co-cure a bismaleimide mixture with various unsaturated $C_{10}$ compounds. Into a glass beaker were weighed 230.90 grams of 4,4'-bismaleimidodiphenylmethane, 38.90 grams of 2,4-bismaleimidotoluene, 36.90 grams of 1,3-bismaleimidobenzene, and 0.9286 grams of phenothiazine. The mixture was heated in an oil bath to 205° C., stirred until homogeneous, and allowed to cool to room temperature, solidifying to an amorphous mass. The mass was then broken up into small pieces and cocured with various terpenes as follows. (This mixture was used instead of a single bismaleimide resin for ease of processing, in order to hinder the bismaleimide from crystalling from its molten mixture with the terpene.)

Approximately 2.4 grams of the above bismaleimide mixture was weighed into each of five 30-mL glass beakers. Limonene, (1S)-β-pinene, α-terpinene, γ-terpinene, and allo-ocimene, respectively, were added to the beakers. The molar ratio of terpene to total bismaleimides in each mixture ranged from 0.99 to 1.01. The beakers were then heated in an oil bath at approximately 150° C., with stirring, until the contents were homogeneous. The mixtures were then poured into molds formed from two sheets of glass separated by a 1/16" (1.6 mm) polytetrafluoroethylene spacer and held together by clamps. The molds were then placed into an oven and the mixtures were cured for 1 hour at 150° C., 1 hour at 180° C., 1 hour at 210° C., 30 minutes at 230° C., 30 minutes at 250° C., 30 minutes at 270° C., and 1 hour at 290° C. The molds were then allowed to cool and the cured resin castings were removed from the molds. Toughness of the resulting solids was assessed with a knife-peel screening test. Results are shown in Table 2.

TABLE 2

| Terpene (purity) | Structure | Casting results |
|---|---|---|
| Limonene<sup>a</sup> (97%) | | Limonene would not mix with molten BMI mixture at 150° C. |
| (1S)-β-Pinene (99%) | | No voids but extremely brittle to knife peel |
| α-Terpinene (85%) | | Full of very large voids; extremely brittle to knife peel |
| γ-Terpinene (95%) | | No voids but brittle to knife peel |

TABLE 2-continued

| Terpene (purity) | Structure | Casting results |
|---|---|---|
| allo-Ocimene (80%) | 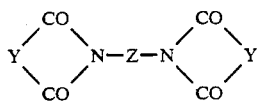 | No voids but brittle to knife peel; mixture gelled in ~2 minutes at 150° C. |

*Cure cycle for limonene was 2 hr at 150° C., 15 min at 170° C., 15 min at 190° C., 15 min at 210° C., 15 min at 230° C., 15 min at 250° C., 15 min at 270° C., and 1 hr at 290° C.

I claim:
1. A composition comprising:
   (a) a bisimide of an unsaturated dicarboxylic acid according to the formula

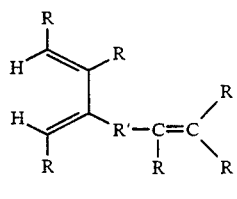

in which Y is a substituted or unsubstituted divalent group containing at least 2 carbon atoms and a carbon-carbon double bond, and Z is a divalent linking group; and
   (b) a triene which is represented by one of formulas I and II

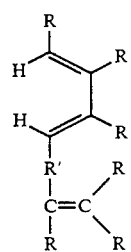

in which each R is selected independently from the group consisting of hydrogen and $C_{1-3}$ alkyl, R' is a divalent linking group, and the isolated double bond adjoins at least one hydrogen-bearing carbon atom.
2. The composition of claim 1 in which R' is $C_{2-12}$ alkylene.
3. The composition of claim 2 in which each R is selected from the group consisting of hydrogen and methyl.
4. The composition of claim 1 in which R' is —O—R"—O—, in which R" is selected from the group consisting of $C_{2-12}$ alkylene and phenylene.
5. The composition of claim 1 in which the triene is myrcene.
6. The composition of claim 1 in which the molar ratio of the triene to the bisimide is within the range of about 0.2–1.0:1.
7. The composition of claim 6 in which the triene is myrcene.
8. The composition of claim 7 in which the bisimide comprises N,N'-4,4'-diphenylmethane bismaleimide.
9. The composition of claim 1 which further comprises from about 0.0002 to about 0.2 moles, per mole of the bisimide, of a free radical polymerization inhibitor.
10. The composition of claim 8 which further comprises from about 0.0002 to about 0.2 moles, per mole of the bisimide, of phenothiazine.
11. The composition of claim 8 in which the molar ratio of the myrcene to the bisimide is within the range of about 0.4–0.8:1.
12. The composition of claim 1 which further comprises a fibrous reinforcing agent.
13. The composition of claim 8 which further comprises carbon fibers.
14. The composition of claim 8 which further comprises glass fibers.
15. An article of manufacture comprising a cured composition according to claim 1.
16. An article of manufacture comprising a cured composition according to claim 12.
17. An electrical laminate comprising the composition of claim 14.
18. A bisimide copolymer prepared by heating the composition of claim 1 at a temperature of at least about 150° C. for at least about 2 hours.
19. A bisimide copolymer prepared by heating the composition of claim 7 at a temperature of at least about 150° c. for at least about 2 hours.
20. A bisimide copolymer prepared by heating the composition of claim 10 at a temperature within the range of about 170° to about 350° C. for a time of at least 2 hours.
21. A method for increasing the fracture toughness of a cured bisimide of an unsaturated dicarboxylic acid of the formula

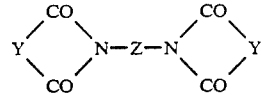

in which Y is a substituted or unsubstituted divalent group containing at least 2 carbon atoms and a carbon-carbon double bond, and Z is a divalent linking group, the method comprising
   (a) blending with the bisimide, in uncured form, from about 0.2 to about 1.0 mole, per mole of the bisimide, of a $C_{6-20}$ triene which is represented by one of formulas I and II

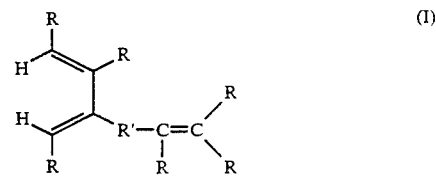

-continued

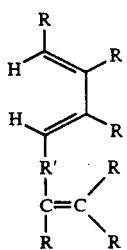
(II)

in which each R is selected independently from the group consisting of hydrogen and $C_{1-3}$ alkyl, R' is a divalent linking group, and the isolated double bond adjoins at least one hydrogen-bearing carbon atom, and (b) heating the resulting blend to a temperature within the range of about 170° to about 350° C. for a time of at least about 2 hours.

22. The method of claim 21 in which the triene is myrcene.

23. The method of claim 22 which further comprises blending with the bisimide from about 0.0002 to about 0.02 moles, per mole of the bisimide, of a free radical polymerization inhibitor.

24. The method of claim 23 in which the myrcene is present in the blend in an amount within the range of about 0.4 to about 0.8 moles per mole of the bisimide.

25. The method of claim 22 in which the bisimide comprises N,N'-4,4'-diphenylmethane bismaleimide.

* * * * *